(12) United States Patent
Salant et al.

(10) Patent No.: US 6,907,365 B2
(45) Date of Patent: Jun. 14, 2005

(54) CONTEXT SENSITIVE TOOLBAR

(75) Inventors: Lawrence Steven Salant, New Hempstead, NY (US); Anthony Cake, Meyrin (CH); John Gregory Hannes, Allendale, NJ (US)

(73) Assignee: Lecroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/015,125

(22) Filed: Dec. 11, 2001

(65) Prior Publication Data

US 2003/0109996 A1 Jun. 12, 2003

(51) Int. Cl.[7] .............................................. G01R 13/02
(52) U.S. Cl. .................................................... 702/68
(58) Field of Search .................... 702/68, 67; 345/606,
345/440, 771, 173, 835, 734, 177, 178;
348/186; 716/6; 455/76; 717/131, 107,
141, 149, 142, 163; 705/7; 713/700; 382/244;
709/205, 250; 707/3; 703/22

(56) References Cited

U.S. PATENT DOCUMENTS

| | | | | |
|---|---|---|---|---|
| 4,740,841 A | * | 4/1988 | Slavin | 348/186 |
| 5,953,009 A | * | 9/1999 | Alexander | 345/771 |
| 6,124,847 A | * | 9/2000 | Chery et al. | 345/173 |
| 6,320,577 B1 | * | 11/2001 | Alexander | 345/440.1 |
| 6,326,987 B2 | * | 12/2001 | Alexander | 345/771 |
| 2001/0000964 A1 | * | 5/2001 | Alexander | 345/440 |
| 2002/0030683 A1 | * | 3/2002 | Alexander | 345/440.1 |

* cited by examiner

Primary Examiner—John Barlow
Assistant Examiner—Tung S Lau
(74) Attorney, Agent, or Firm—Frommer Lawrence & Haug LLP; William S. Frommer (57) ABSTRACT

An oscilloscope apparatus, comprising a display for displaying a plurality of objects, a toolbar displayed on the display, and a user interface for selecting an object. The display displays one or more functions on the toolbar corresponding to the selected object.

34 Claims, 7 Drawing Sheets

CONTEXT SENSITIVE TOOLBAR

BACKGROUND OF THE INVENTION

The present invention relates generally to a method and apparatus for processing waveform data acquired by an oscilloscope using a streaming architecture.

A Digital Oscilloscope is a complex instrument for measuring electrical signals. It is composed of many electronic hardware modules and many software modules that cooperate together in capturing, processing, displaying and storing information that characterizes the signals of interest to an operator. There are several groups of requirements that need to be addressed when creating instruments that are easy to set up and use, despite the inherent complexity of the task.

SUMMARY OF THE INVENTION

Modern digital oscilloscopes display many types of informational objects on the screen. Some of the types of information include "raw" acquisition waveforms, processed waveforms, cursors which also display numerical information corresponding to the waveforms, automated measurements on the waveforms, and axis labels and/or descriptors to indicated the scales of the waveforms. Typically, a DSO has separate menus which allow the user to configure a channel, setup a math function, turn on cursors or measurements, etc.

The purpose of the invention is to allow the user to perform common operations on major system objects in the simplest manner possible. According to the invention, the user selects an object he is currently interested in and the system displays the most common processing or display functions on a toolbar that are associated with the type of selected object. When the user selects an item from the toolbar, the system automatically defines the object as source for the selected object, thus simplifying setup of the selected operation. For example, if the user selects a channel the toolbar may include items such as (but not limited too): turn off channel, setup this channel, define a zoom of this channel, define a math trace that uses this channel as the source, and define measurements on this channel. Thus, the general system toolbar is not inundated with selections for each possible selectable function, and upon selection of an object on the oscilloscope, the user can easily determine all possible functions available for use with the selected object.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combinations of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The preferred embodiments of the apparatus and method according to the present invention will be described with reference to the accompanying drawings. These preferred embodiments are applicable to conventional as well as an improved modular oscilloscope design, as will be described below.

In accordance with the invention, an improved oscilloscope design is provided that is completely "modular", whereby the elements composing the oscilloscope software are completely specified in terms of interface, and are sufficiently independent in construction that they can be installed and removed at run-time, (e.g. without stopping the process which can be considered the oscilloscope application software). This is in contrast to existing products that include software that must be wholly replaced (in it's entirety) in order to change any small attribute of the software. This inventive approach offers commercial advantage because is shortens the overall logistics of releasing new software features, fundamental to the product or fundamental to a particular application of the product. As such, a special feature can be added after a customer has taken delivery and has the instrument (oscilloscope) in operation, after the fact, without the requirement to return or for that matter even stop using the instrument. This is of value to both the customer and the manufacturer.

Further, the modular design permits "unit testing" to further advance the quality of the overall product by permitting each individual component of the software to be tested in a standard "test harness". Each component is provided with a standardized interface especially conceived to permit isolated testing. This forward looking, quality conscious aspect of the design assures final deployments of the product(s) are not hampered by the inability to localize faulty components. While these inventive oscilloscopes ease the implementation of the present invention, the present invention may be applied to any oscilloscope.

Figure 1:
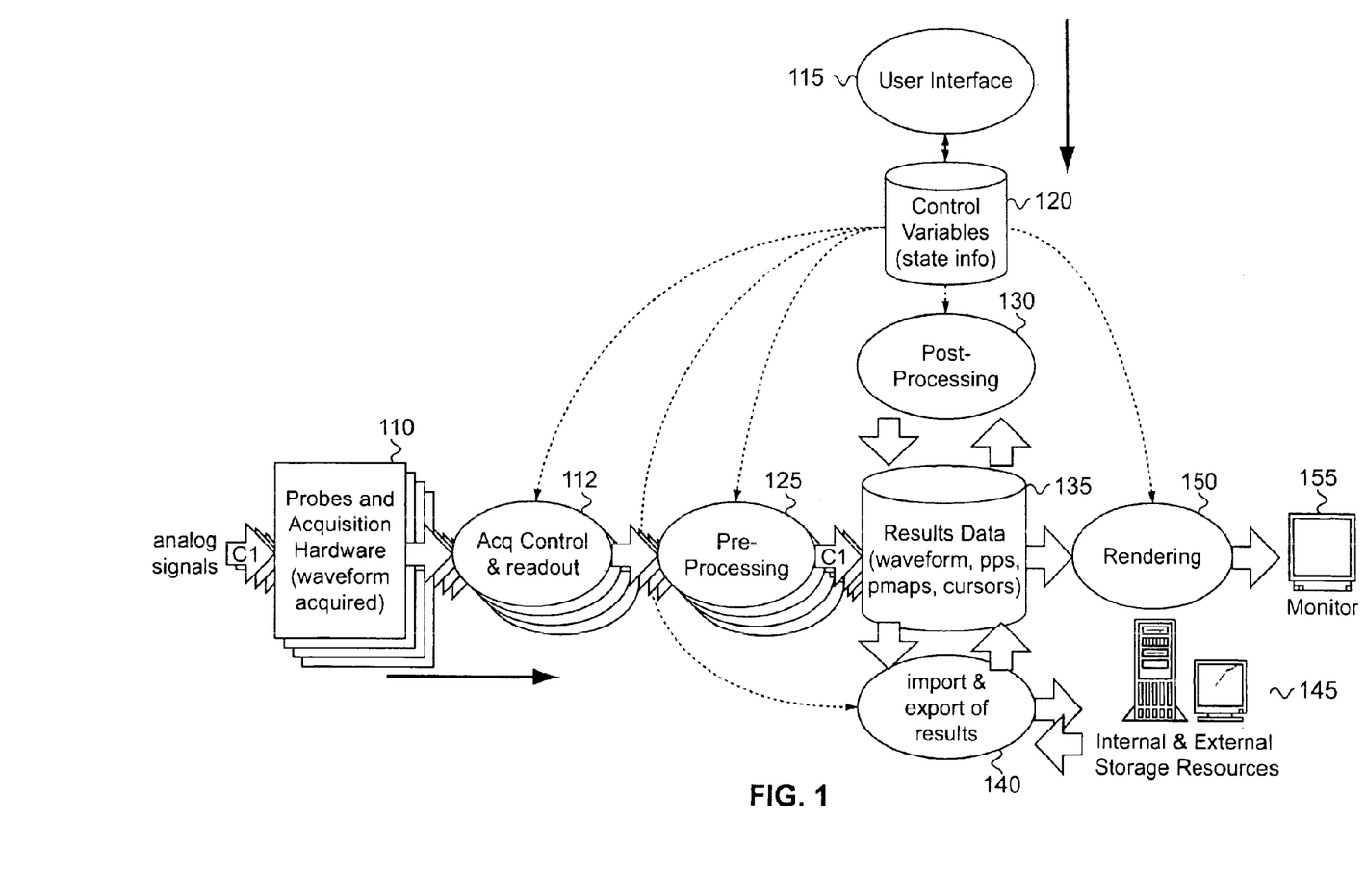
FIG. 1 is a graphical depiction of a conceptualization of the operation of an oscilloscope constructed in accordance with the invention.

FIG. 1 depicts a conceptualized notion of how the oscilloscope constructed in accordance with the invention operates. The flow of data is shown from left to right and control sequences provided by a user, either automated or manual, are shown from top down. As is shown in FIG. 1, a plurality of analog acquisition signals $C_1$ are acquired by the oscilloscope of the invention. These acquisition signals are that are in turn controlled by an acquisition control module 112 acquired in accordance with various provided probes and other acquisition hardware 110. Various acquisition control processes are applied to the acquired waveforms in accordance with various control variables 120 provided by the user via a user interface 115.

Thereafter, various results data are provided to, and thereafter output from a preprocessing system 121, and are in turn acted upon in various post processing functions 130 employing user defined control variables, resulting in processed data (Results data) 135. The post-processed data is then exported and/or imported at 140 as necessary for further processing by the system 145. After processing has been completed, the various processed data is converted for display at 150 on a display device 155.

In accordance with the inventive graphical representation of the processing web of FIG. 1, a Processing Web Editor (PWEditor) is a tool provided in accordance with the invention for presenting the graphical representation of the configuration of a Processing Web (Web) to a user, enabling the web to be reconfigured, and enabling the properties of the various elements in the web to be viewed and modified by the user. Thus, instead of the fixed and constrained processing web shown in FIG. 1, a processing web for a more advanced oscilloscope may be constructed in accordance with the invention. This more advanced processing web may be edited in accordance with the PWEditor and may be configured in any manner desired by a user to generate any desired results, as will be described below. The Processing Web defines the flow of data from the input of a DSO through various stages of processing to the display device, as noted above.

As noted above, modern digital measurement instruments and oscilloscopes (DSO) display many types of informational objects on the screen. Some of the types of information include "raw" acquisition waveforms, processed waveforms, cursors which also display numerical information corresponding to the waveforms, automated measurements on the waveforms, and axis labels and/or descriptors to indicated the scales of the waveforms. Typically, a DSO has separate menus which allow the user to configure a channel, setup a math function, turn on cursors or measurements, etc.

The invention can be used during normal oscilloscope operations, or in accordance with design of the processing web, through the PWEditor described above. The invention is also applicable to standard oscilloscopes that do not employ such a processing web. Traditionally, digital storage oscilloscopes (DSOs) capture an electrical signal (waveform) and allow the user to view a trace of the captured signal in a time (x-axis) versus amplitude (y-axis) display. In addition to displaying the signal's trace, DSOs can perform mathematical processing on the captured waveform. This processing can be used to transform the entire waveform or to determine certain properties (features, parameters, measurements) of the captured signal. These properties are traditionally displayed as individual values associated with a particular signal trace on the DSO's screen. Typically, the processing is controlled and/or preselected using various display menus.

When analyzing a single feature of a particular captured signal (e.g. the rising edge of a signal), the ability to display processed values is a valuable tool. DSOs are now capable of performing numerous complex processing operations.

The purpose of the invention is to allow the user to perform common operations on the major system objects in the simplest manner possible. According to the invention, the user selects an object and system displays on a toolbar the most common functions that are associated with, and therefore may be implemented with, the selected object. When the user selects an item from this context sensitive toolbar, the system automatically defines the object as the source for the selected object, thus simplifying setup of the selected operation. For example, if the user selects a channel, a context sensitive toolbar associated with a channel selection is displayed, and may include items such as (but not limited too): turn off channel, setup this channel, define a zoom of this channel, define a math trace that uses this channel as the source, and define measurements on this channel. The selection of other objects from the oscilloscope display results in the display of other context sensitive toolbars related to the selected objects. While a toolbar is described, this toolbar refers to any portion of a display, predefined and reserved, or as an overlay pop-up feature that provides additional controls, functionality or other information that is accessible by a user.

Figure 2:
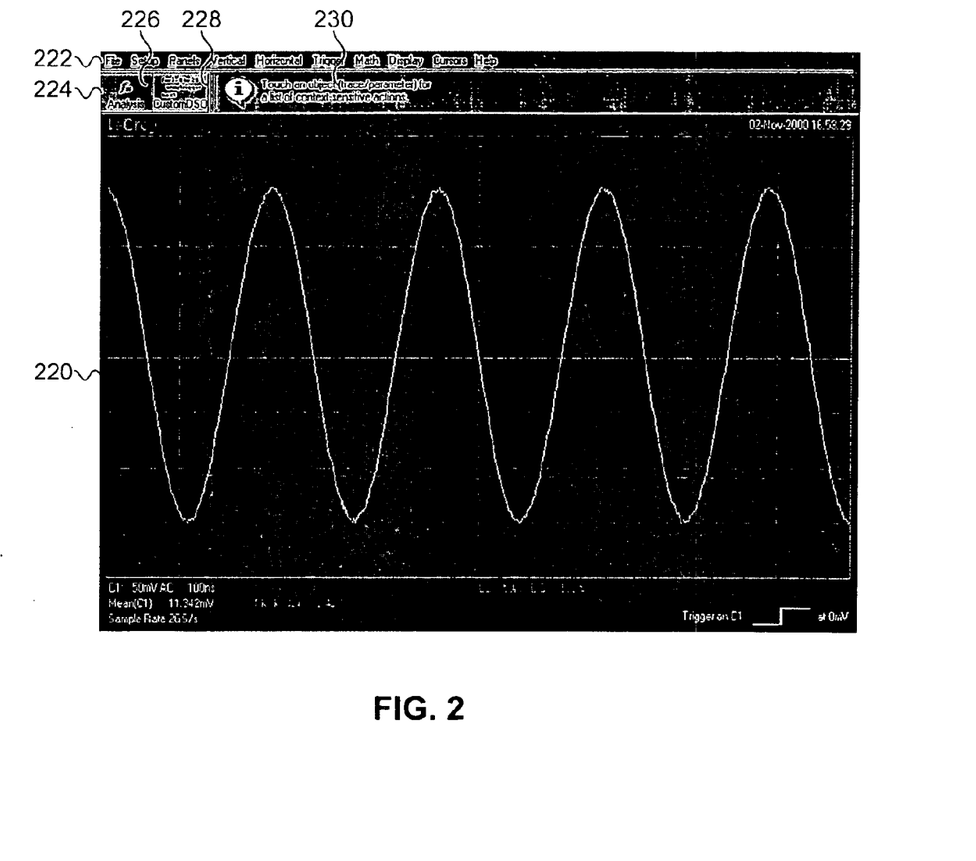
FIG. 2 shows an instrument screen using the present invention.
Figure 3:
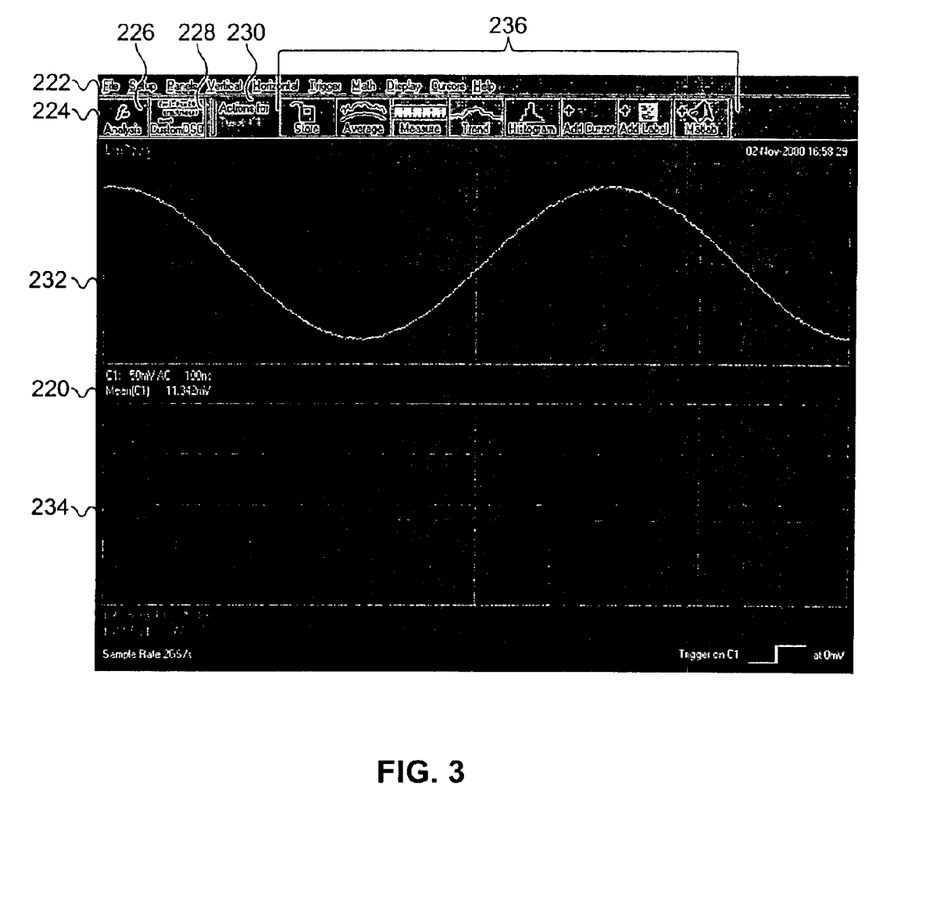
FIG. 3 shows an instrument screen using the present invention.

FIG. 2 shows an instrument screen employing the present invention. As is shown on screen 220 in FIG. 2, a menu bar 222, includes a toolbar 224 that has a standard set of icons such as an Analysis icon 226 and a Custom DSO icon 228. The toolbar 224 also has an area 230 for context sensitive icons that are determined by the last item (e.g trace, parameter, grid, etc) selected. In this case shown in FIG. 2, no item is selected. After the user selects a channel, such as channel 1 via pointing device such as a touch screen, mouse, or the instrument front panel or remote control, the context sensitive area 230 of the toolbar shows the specific operations or functions 236 the user can choose from to operate on the signal associated with channel C1, as shown in FIG. 3. For example, selecting an average icon will display a trace, which is the average of trace C1.

Figure 4:
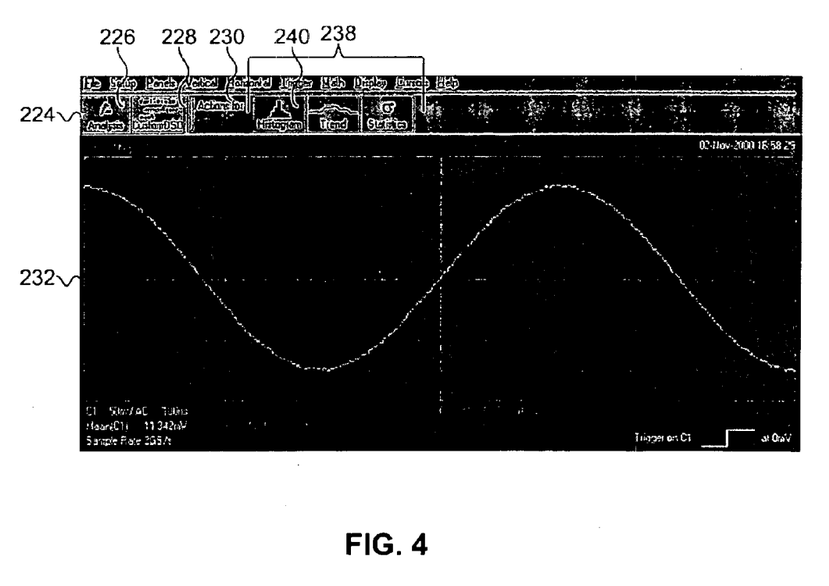
FIG. 4 shows an instrument screen using the present invention.

In FIG. 4, a user has selected a Mean (C1) measurement. Toolbar 224, in area 230, therefore includes specific operations available for measurements 238 associated with operation Mean (C1). For example, if a histogram button 240 is selected, a histogram of the mean of the signal on channel C1 is automatically displayed.

Figure 5:
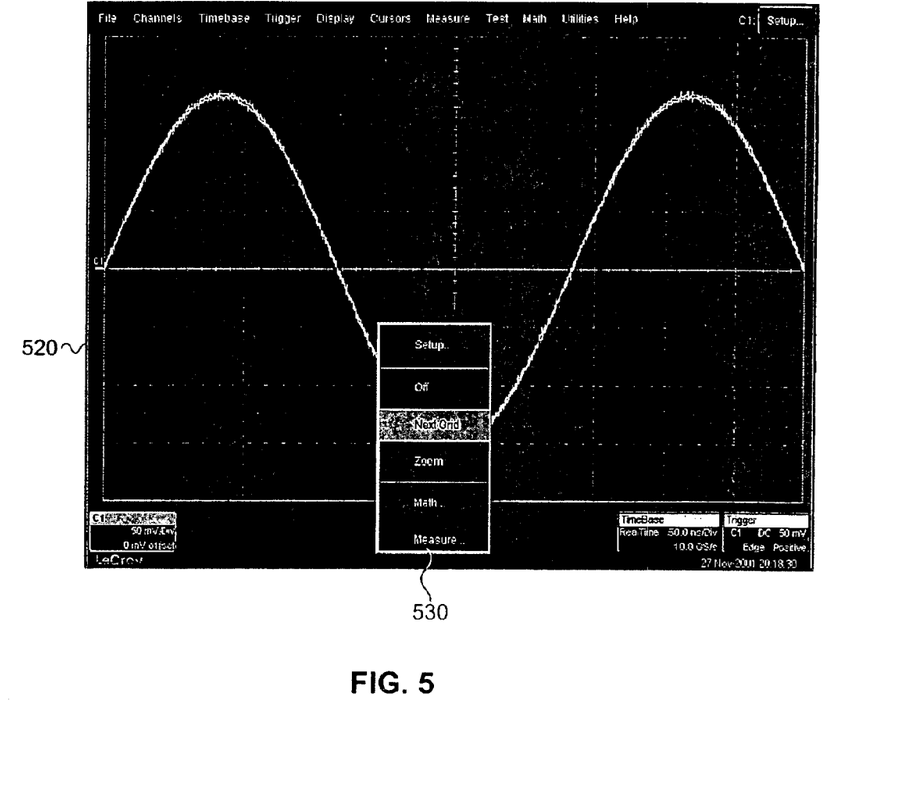
FIG. 5 shows an alternate embodiment of the present invention.

An alternate embodiment of the invention is shown in FIG. 5. In this embodiment, a toolbar 530 pops up on screen 520 when the user selects an object. This embodiment has the advantage of not requiring a reserved area of toolbar 224 for context sensitive toolbar 530. The disadvantage of this embodiment is that toolbar 530 may cover part of the user's data. Toolbar 530 is removed when the user selects another object, or scrolls elsewhere on screen 520 and therefore is only available when desired.

Figure 6:
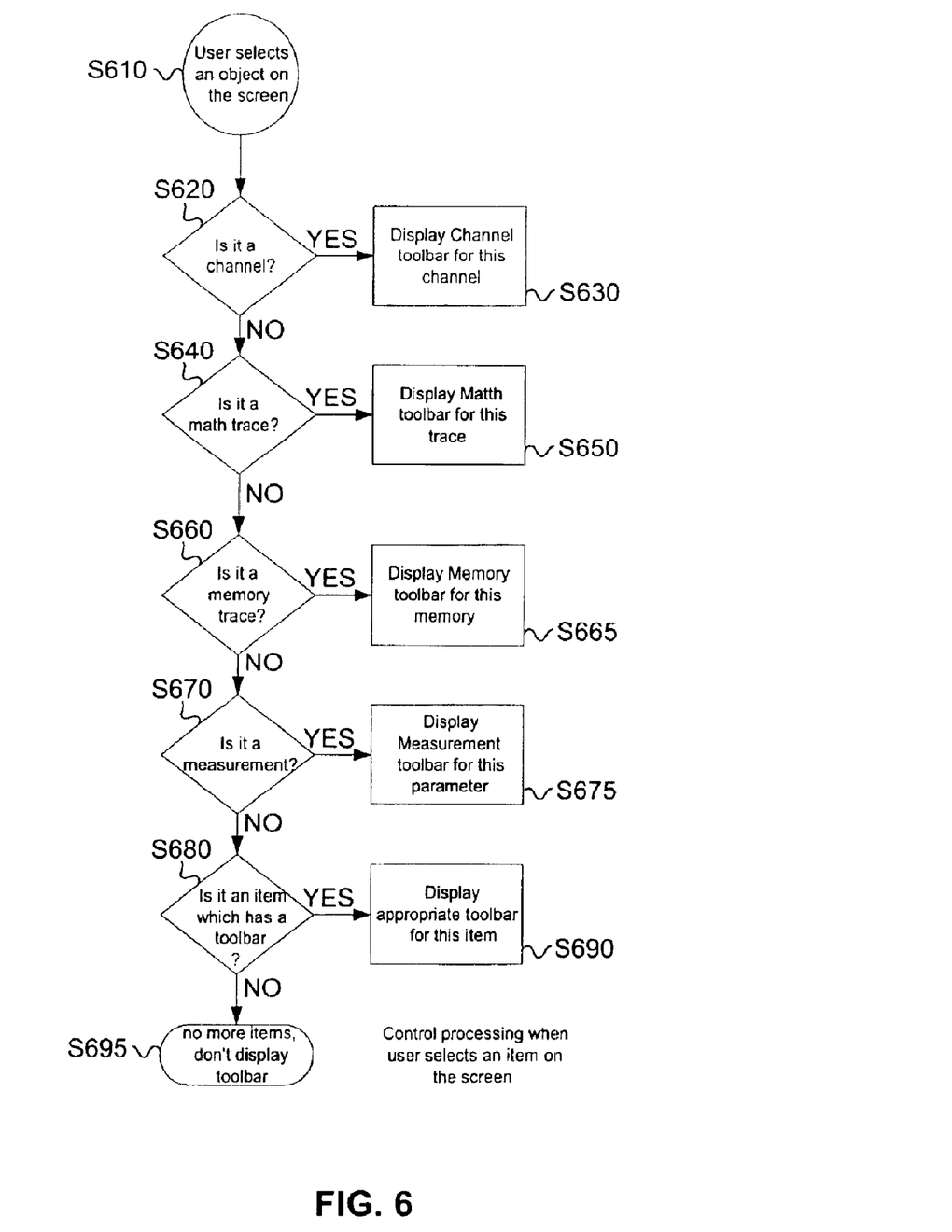
FIG. 6 is a flowchart of the operation of the present invention.

FIG. 6 shows a flowchart of the operation when a user selects an object on the screen. In step S610, the user selects an object on the screen. In step S620, a determination is made whether the user has selected a channel or not. If the user has selected a channel, then in step S630 a context sensitive toolbar including functionality associated with the selected channel is displayed. If the user did not select a channel at step S620, control passes to step S640 where a determination is made whether the user has selected a math trace. If it is determined that the user has selected a math trace, then in step S650, a context sensitive toolbar including functionality associated with the selected math trace is displayed. If the user has not selected a math trace at step S640, then at step S660 a determination is made whether the user has selected a memory trace. If it is determined that the user has selected a memory trace, then in step S665 a context sensitive toolbar including functionality associated with the selected memory trace is displayed. If it is determined that the user has not selected a memory trace, then in step S670, it is determined whether the user has selected a measurement. If the user has selected a measurement, then in step S675, a context sensitive toolbar including functionality associated with the selected measurement is displayed. If not, then in step S680, it is determined whether a context sensitive toolbar associated with the selected item exists. If such a toolbar exists, then in step S690 the appropriate context sensitive toolbar for the selected item is displayed. If it is determined that such a context sensitive toolbar does not exist, then in step S695 no additional toolbar is displayed.

Figure 7:
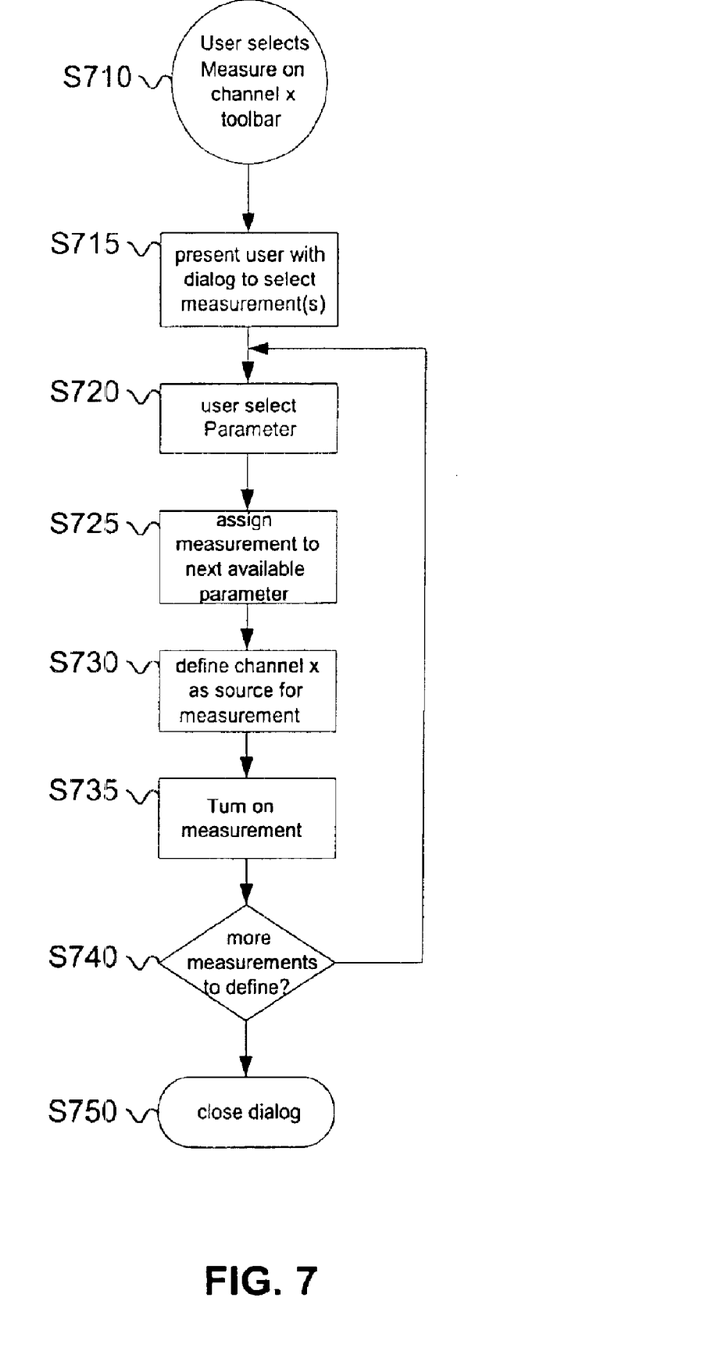
FIG. 7 is an additional flowchart of the operation of the present invention.

FIG. 7 is a flowchart that shows how the invention reduces the number of steps needed to perform common operations. Note that in this example, a setup dialog is presented to the user, but this is not required for all operations from the toolbar. In this flowchart, the operation of selecting a "Measure" object from a context sensitive toolbar associated with a selected channel 1 receiving an input waveform is described after selecting channel x, and displaying a context sensitive toolbar including functionality associated with the selection of a channel. In step S710, the user selects Measure on the channel context sensitive toolbar. In step S715, the user is presented with a dialog to select a measurement or measurements. In step S720, the user selects a parameter and in step S725, the measurement is assigned to the next available parameter. In step S730, channel x is defined as the source for the measurement, and in step S735 the measurement feature is implemented. In step S740 a determination is made as to whether there are more measurements to define. If yes, then control returns to step S720. If there are no more measurements to define, then in step S750, the dialog is closed.

A further enhancement would be to have the scope "learn" what types of operation a particular user performs on each object type and dynamically add these features. Therefore, if a user selects a particular object, and then a further function (from a full menu of functions available on the oscilloscope, or other convenient location) to operate on that object, that function is added to the context sensitive toolbar associated with the selected object. Upon selection of a similar object in the future, the previously selected functionality is provided on a context sensitive toolbar, as described above. Thus, functions actually used by the user populate the various context sensitive toolbars associated with various objects. Of course, if a function is provided on a context sensitive toolbar and is not used b a user, this function may be removed from the toolbar in a similar fashion. Because in many labs, an oscilloscope is shared by more that one user, this feature may not be desirable and if included, the user is able override the feature.

While all provision of a context sensitive toolbar has been determined by a selected object, such toolbar provisions are not so limited. Certain functionality may also be provided based upon a value of a particular object. For example, if all values of a particular trace are very low, a zoom function may be provided, while if all of the values are so large as to not fit on a display, a zoom out function may be provided. As a further example, if a user selects a histogram object, in addition to displaying various context sensitive toolbar information associated with a histogram, if it is determined that the values in the histogram are extremely low, a functionality to change the bin width might be provided. While only as an example, any such value-based functionality in a context sensitive toolbar may be provided.

It will thus be seen that the objects set forth above, among those made apparent from the preceding description, are efficiently attained and, because certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An oscilloscope apparatus operable to measure electrical signals, said oscilloscope apparatus comprising:
   a display for displaying a plurality of data signals acquired and processed by the oscilloscope;
   a user interface for selecting one of said displayed data signals; and
   a toolbar comprising a plurality of choices displayed on said display, the displayed plurality of choices being selected from among a universal set of choices, only the most common ones of said universal set of choices that apply to the selected data signal determined by the characteristics of the type of selected data signal being displayed in the toolbar, the selected data signal being defined as the data source for the displayed items of the toolbar.

2. The oscilloscope apparatus according to claim 1, wherein the data signal is a waveform.

3. The oscilloscope apparatus according to claim 1, wherein the data signal is a measurement.

4. The oscilloscope apparatus according to claim 1, wherein the data signal is a cursor value.

5. The oscilloscope apparatus according to claim 4, wherein an item is change types.

6. The oscilloscope apparatus according to claim 4, wherein an item is turned off.

7. The oscilloscope apparatus according to claim 1, wherein the data signal is a parameter.

8. The oscilloscope apparatus according to claim 7, wherein an item is trend.

9. The oscilloscope apparatus according to claim 7, wherein an item is set up.

10. The oscilloscope apparatus according to claim 7, wherein an item is histogram.

11. The oscilloscope apparatus according to claim 1, wherein the data signal is a channel.

12. The oscilloscope apparatus according to claim 11, wherein an item is setup channel.

13. The oscilloscope apparatus according to claim 11, wherein an item is define zoom.

14. The oscilloscope apparatus according to claim 11, wherein an item is define math trace.

15. The oscilloscope apparatus according to claim 11, wherein an item is define measurements.

16. The oscilloscope apparatus according to claim 1, wherein the data signal is a trace.

17. The oscilloscope apparatus according to claim 1, wherein the data signal is a grid.

18. The oscilloscope apparatus of claim 1, wherein one or more of the displayed plurality of choices may comprise a choice, selected by a user from a standard menu, that was not previously presented on the toolbar.

19. An oscilloscope apparatus operable to measure electrical signals, said oscilloscope apparatus comprising:
   a display for displaying a plurality of received or processed data signals;
   a user interface for selecting one of said displayed data signals displayed on said display; and
   a pop-up context sensitive toolbar displayed on said display, said context sensitive toolbar displaying a plurality of choices being selected from among a universal set of choices, only the most common ones of said universal set of choices that apply to said selected data signal determined by the characteristics of the type of selected data signal being displayed in the toolbar, the selected data signal being defined as the data source for the displayed items of the toolbar.

20. The apparatus of claim 19, wherein said items displayed on said context sensitive toolbar are predetermined.

21. The apparatus of claim 19, wherein said items displayed on said context sensitive toolbar are determined based upon prior use of a particular item in conjunction with said selected data signal.

22. The apparatus of claim 21, wherein said item is displayed on said context sensitive toolbar if it has been previously used with said selected data signal.

23. The apparatus of claim 21, wherein said item is removed from said context sensitive toolbar if it has not previously been used with selected data signal.

24. The apparatus of claim 19, wherein said items displayed on said context sensitive toolbar are determined based upon one or more values of said selected data signal.

25. The oscilloscope apparatus of claim 19, wherein one or more of the displayed plurality of choices may comprise a choice, selected by a user from a standard menu, that was not previously presented on the context sensitive toolbar.

26. A method for viewing a waveform on an oscilloscope operable to measure electrical signals, comprising the steps of:
   displaying a plurality of data signals acquired and processed by the oscilloscope;
   selecting one of said data signals displayed on said display; and
   displaying a toolbar comprising a plurality of choices, the displayed plurality of choices being selected from among a universal set of choices, only the most common ones of said universal set of choices that apply to the type of selected data signal determined by the characteristics of the selected data signal being displayed in the toolbar, the selected data signal being defined as the data source for the displayed items of the toolbar.

27. The apparatus of claim 26, wherein said items displayed on said context sensitive toolbar are predetermined.

28. The apparatus of claim 26, wherein said items displayed on said context sensitive toolbar are determined based upon prior use of a particular item in conjunction with said selected data signal.

29. The apparatus of claim 26, wherein said items displayed on said context sensitive toolbar are determined based upon one or more values of said selected data signal.

30. The method of claim 26, wherein one or more of the displayed plurality of choices may comprise a choice, selected by a user from a standard menu, that was not previously presented on the toolbar.

31. A method for viewing a waveform on an oscilloscope operable to measure electrical signals, comprising the steps of:
   displaying a plurality of data signals acquired and processed by the oscilloscope;
   selecting one of said data signals displayed on said display; and
   displaying a pop-up context sensitive toolbar, said context sensitive toolbar displaying a plurality of choices being selected from a universal set of choices, only the most common ones of said universal set of choices that apply to said selected data signal determined by the characteristics of the type of selected data signal being displayed in the toolbar, the selected data signal being defined as the data source for the displayed items of the toolbar.

32. The method of claim 31, wherein one or more of the displayed plurality of choices may comprise a choice, selected by a user from a standard menu, that was not previously presented on the context sensitive toolbar.

33. An oscilloscope apparatus operable to measure electrical signals, said oscilloscope apparatus comprising:
   an acquisition unit for acquiring a waveform;
   a processor for processing said waveform to obtain a plurality of measurements;
   a renderer for displaying said waveform and a plurality of data signals acquired and processed by the oscilloscope respectively and showing the plurality of measurements on a display; and
   a toolbar comprising a plurality of choices displayed on said display the displayed plurality of choices being selected from among a universal set of choices, only the most common ones of said universal set of choices that apply to the selected data signal determined by the characteristics of the type of selected data signal being displayed in the toolbar, the selected data signal being defined as the data source for the displayed items of the toolbar.

34. The oscilloscope apparatus of claim 33, wherein one or more of the displayed plurality of choices may comprise a choice, selected by a user from a standard menu, that was not previously presented on the toolbar.

* * * * *